United States Patent
van Zelm et al.

(10) Patent No.: US 8,509,712 B2
(45) Date of Patent: *Aug. 13, 2013

(54) MULTI-DIMENSIONAL VOLTERRA SERIES TRANSMITTER LINEARIZATION

(75) Inventors: John-Peter van Zelm, Calgary (CA); Peter Rashev, Calgary (CA); John Holt, Calgary (CA)

(73) Assignee: Research In Motion Limited, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/616,159

(22) Filed: Sep. 14, 2012

(65) Prior Publication Data
US 2013/0005283 A1     Jan. 3, 2013

Related U.S. Application Data

(63) Continuation of application No. 12/252,098, filed on Oct. 15, 2008, now Pat. No. 8,331,879.

(51) Int. Cl.
*H04B 1/04* (2006.01)

(52) U.S. Cl.
USPC .................. 455/114.3; 455/126; 375/297

(58) Field of Classification Search
USPC ............. 455/114.2, 114.3, 126, 127.1, 127.2; 375/296, 297; 330/149
See application file for complete search history.

(56) References Cited

U.S. PATENT DOCUMENTS
8,331,879 B2 * 12/2012 van Zelm et al. .......... 455/114.3

* cited by examiner

*Primary Examiner* — Nguyen Vo

(57) ABSTRACT

A radio transmission system comprising a plurality of Volterra Engine (VE) linearizers; a power amplifier (PA) coupled to the YE linearizers; a feedback circuitry coupled to the VE linearizers and the PA; and at least one adaptive controller coupled to the feedback circuitry, wherein each VE linearizer is coupled to at least another VE linearizer in series, in parallel, or both, and is configured to compensate for at least one distortion aspect of an output signal from the PA.

20 Claims, 11 Drawing Sheets

MULTI-DIMENSIONAL VOLTERRA SERIES TRANSMITTER LINEARIZATION

CROSS-REFERENCE TO RELATED APPLICATIONS

This application in a continuation of U.S. patent application Ser. No. 12/252,098, filed Oct. 15, 2008, now U.S. Pat. No. 8,331,879, entitled "MULTI-DIMENSIONAL VOLTERRA SERIES TRANSMITTER LINEARIZATION," which is incorporated herein by reference.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present invention relates generally to distortion compensation in radio transmitters and, more particularly, to a system and method for improving amplified signal linearization.

BACKGROUND OF THE INVENTION

In wireless communications, signals are forwarded using transmission and receiving systems, such as radio based transmitters and receivers. Signal transmission systems may include power amplifiers (PAs), linearizers that compensate for signal distortions in the transmission systems, antennas, and other signal processing components. Modern wireless communications standards, such as 4G cellular standards, require special signaling formats or modulations, which exhibit higher and rapidly varying peak to average ratios (PARs), such as Orthogonal frequency-division multiplexing (OFDM) based signaling formats. To support such signaling formats, the PAs can be combined with high cost peak-power reduction (PPR) techniques, which also yields some drawbacks or inefficiencies. For example, supporting such signaling formats requires increased power back-off, application of strong PPR techniques, or both, which results in degrading the link capacity and/or cell coverage.

On the other hand, more advanced PAs, such as Doherty or Asymmetrical Doherty amplifiers, can support such signaling formats without such inefficiencies. However, the advanced PAs can also introduce significant distortions, including non-linear responses with strong undesired memory effects and transients, such as time-varying behaviors. To compensate for such effects, digital pre-distortion linearizers can be used with the more advanced PAs. However, the digital pre-distortion linearizers require more complex modeling and more resources, which may be difficult to implement. For instance, undesired numerical effects, associated with the complexity of implementation, can impair or limit the use of adaptive or more flexible models, which in turn limits the overall performance of the transmission system.

SUMMARY OF THE INVENTION

In one embodiment, the disclosure includes a radio transmission system. The radio transmission system comprises a plurality of Volterra Engine (VE) linearizers coupled in a series architecture, a parallel architecture, or both; a power amplifier (PA) coupled to the VE linearizers; a feedback circuitry coupled to the VE linearizers and the PA; and at least one adaptive controller coupled to the feedback circuitry, wherein the series architecture, the parallel architecture, or both improve linearization efficiency and distortion compensation in the radio transmission system.

In another embodiment, the disclosure includes a signal distortion compensation system. The signal distortion compensation system comprises a first Volterra Engine (VE) linearizer; a power amplifier (PA) coupled to the first VE linearizer; at least one second VE linearizer coupled to the first VE linearizer; and a feedback circuitry coupled to the PA and the second VE linearizer, wherein the first VE linearizer is configured to linearize and reduce distortion in an output signal amplified by the PA, and wherein the second VE linearizer is configured to de-embed feedback distortion in a feedback signal or model at least one system response.

In yet another embodiment, the disclosure includes a signal distortion compensation method. The signal distortion compensation method comprises converting a digital input signal into an analog output signal; amplifying the analog output signal; receiving a digital feedback signal from the amplified analog output signal; and reducing distortion in the amplified analog output signal using the digital feedback signal based on a plurality of convolved Volterra-series based models using a plurality of corresponding digital reference signals, a plurality of alternative Volterra-series series based models using a single shared digital reference signal, or both.

Other aspects and features of the present invention will become apparent to those of ordinary skill in the radio communications art upon review of the following description of specific embodiments of the invention in conjunction with the accompanying figures.

DETAILED DESCRIPTION OF THE PREFERRED EMBODIMENTS

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents.

Disclosed herein is a signal transmission system and method using a plurality of Volterra Engine (VE) linearizers coupled to a PA in a transmission system, which may provide improved linearization efficiency and distortion compensation. Specifically, the VE linearizers may be combined in an optimized series architecture, parallel architecture, or combined architecture, where each VE linearizer may be used to compensate, via inverse modeling, for at least one distortion aspect of the output signal. As such, the combined VE linearizers may implement more complex models to better account for distortions in the system response, such as amplification distortion, which may be introduced by the PA. Further, the VE linearizers may be combined in a plurality of architectures to support de-embedding of feedback distortion, modeling a plurality of system responses, or both, which may further improve overall system performance.

Figure 1:
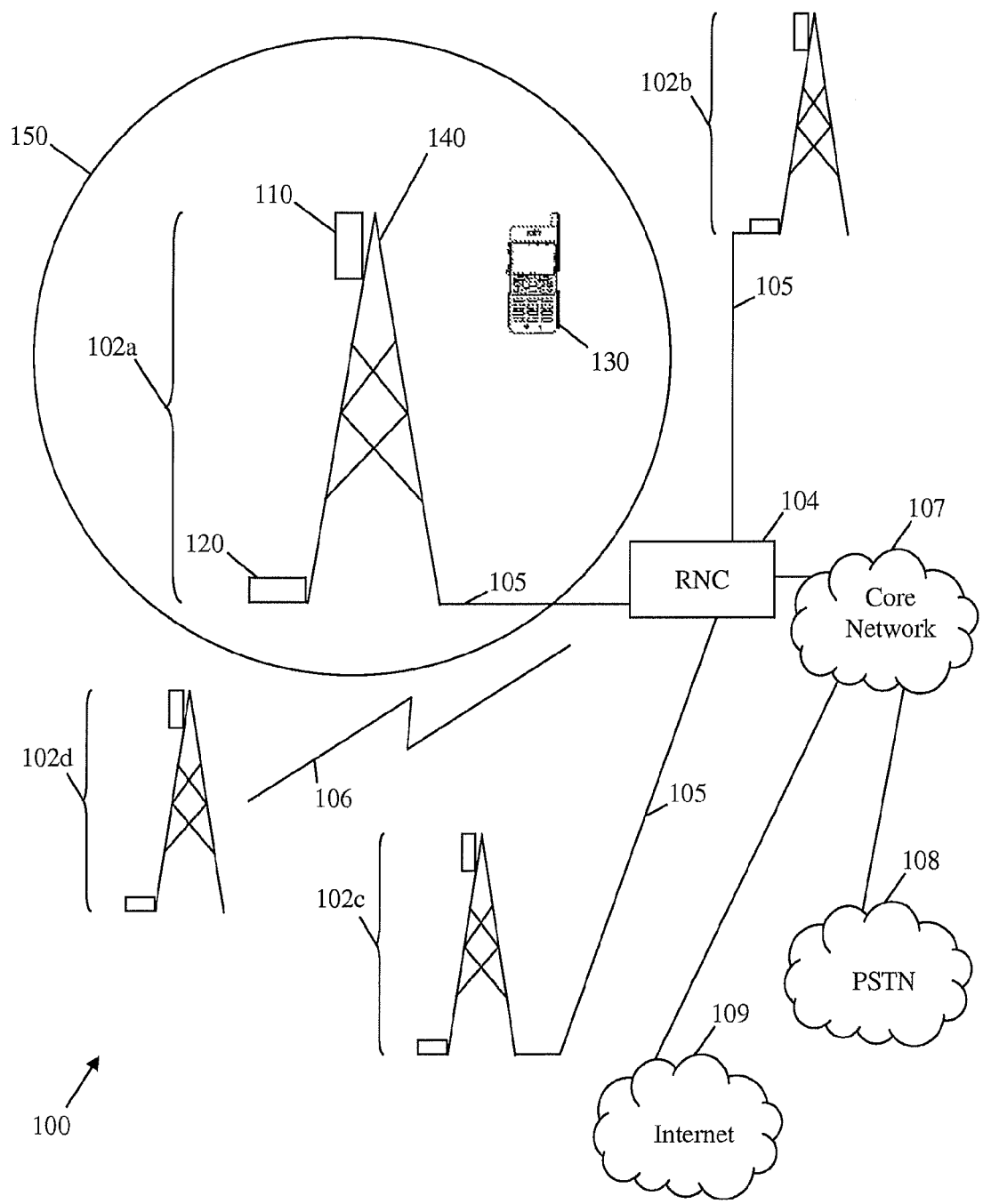
FIG. 1 is an illustration of an embodiment of a wireless communication system.

FIG. 1 illustrates one embodiment of a wireless communication system 100 in accordance with this disclosure. The wireless communication system 100 may be a cellular communications network, which may comprise a plurality of base transceiver stations (BTSs) 102a, 102b, 102c and 102d for providing wireless communications to a prescribed coverage area. Although, four BTSs are shown in the figure, the wireless communication system 100 may comprise any number of BTSs, which may be configured similarly or differently. Additionally, the wireless communication system 100 may comprise a Radio Network Controller (RNC) 104, which may be coupled to the BTSs 102a, 102b, 102c, and 102d by means of physical or wireless connections. For instance, the BTSs 102a, 102b, and 102c may be each coupled to the RNC 104 by a physical connection 105, while the BTS 102d may be coupled to the RNC 104 by a wireless connection 106. The wireless communication system 100 may also comprise a wireless communication device 130, which may be present or located within the prescribed coverage area of the wireless communication system 100. Although, only one wireless communication device 130 is shown in the figure, the wireless communication system 100 may also comprise any number of wireless communication devices 130, which may be configured similarly or differently. Accordingly, the RNC 104 may be configured to maintain or control wireless communications between the wireless communication device 130, and the BTSs 102a, 102b, 102c, 102d. Further, the RNC 104 may be coupled to a core network 107, which may include a mobile switchgear, a user validation, a gateway, or combinations thereof. In turn, the core network 107 may be coupled to other networks, such as a public switched telephone network (PSTN) 108, the Internet 109, at least one other wireless network (not shown), or combinations thereof.

The wireless communication device 130 may wirelessly communicate with any of the BTSs 102a, 102b, 102c, and 102d depending on its location or position within the prescribed coverage area. For instance, a wireless link established between the wireless communication device 130 and the BTS 102a, 102b, 102c, or 102d may be shifted or "handed off" to another BTS 102a, 102b, 102c, or 102d, when the mobile terminal 130 is moved or repositioned from a proximity of the BTS 102a, 102b, 102c, or 102d to the other BTS 102a, 102b, 102c, or 102d. Further, the wireless link may conform to any of a plurality of telecommunications standards or initiatives, such as those described in the 3rd Generation Partnership Project (3GPP), including Global System for Mobile communications (GSM), General Packet Radio Service (GPRS)/Enhanced Data rates for Global Evolution (EDGE), High Speed Packet Access (HSPA), Universal Mobile Telecommunications System (UMTS), and Long Term Evolution (LTE). Additionally or alternatively, the wireless link may conform to any of a plurality of standards described in the 3rd Generation Partnership Project 2 (3GPP2), including Interim Standard 95 (IS-95), Code Division Multiple Access (CDMA) 2000 standards 1xRTT or 1xEV-DO. The wireless link may also be compatible with other standards, such as those described by the Institute of Electrical and Electronics Engineers (IEEE), or other industry forums, such as the Worldwide Interoperability for Microwave Access (WiMAX) forum.

The BTS 102a, and similarly any of the BTSs 102b, 102c, and 102d, may comprise a DCR 110, a modem 120, and a communication tower 140. The DCR 110 and the modem 120 may each be coupled to the communication tower 140 and may communicate with one another. The DCR 110 may also communicate with the wireless communication device 130 over an area substantially covered by a signal range 150 corresponding to the BTS 102a. The DCR 110 and the wireless communication device 130 may communicate using a cellular technology standard, such as a Time Division Multiple Access (TDMA), CDMA, UMTS, or GSM. The DCR 110 and the wireless communication device 130 may communicate using other cellular standards, such as a WiMAX, LTE, or Ultra Mobile Broadband (UMB).

The DCR 110 may be an agile radio head, which may be reconfigured using software or firmware to extend or reduce the signal range 150, or to increase the capacity of the wireless communication system 100. For instance, the DCR 110 may be reconfigured using a software application to communicate with an additional number of wireless communication devices 130. The DCR 110 may comprise a plurality of transmitters, a plurality of receivers, or both to support at least one smart antenna operation mode, such as Multiple-Input and Multiple-Output (MIMO) or Single-Input and Single-Output (SISO). For instance, the DCR 110 may be reconfigured without hardware changes or upgrades to support signal features comprising power combining, beam forming, sector power pooling, or combinations thereof. Reconfiguring the DCR 110 without hardware changes may reduce reconfiguration or upgrade requirements or cost, such as eliminating or reducing the need for climbing the communication tower 140, renting or deploying infrastructure lifting or transfer equipments, or using additional hardware.

The wireless communication device 130 may be any device capable of transmitting or receiving a signal, such as an analog or digital signal, to and from a radio such as the DCR 110, using a wireless technology. The wireless communication device 130 may be a mobile device configured to create, send, or receive signals, such as a handset, a personal digital assistant (PDA), a cell phone (also referred to as a "mobile terminal"), or a wireless-enabled nomadic or roaming device, such as a laptop computer. Further, the wireless communication device 130 may be optionally configured to provide at least one data service, such as an e-mail service. Alternatively, the wireless communication device 130 may be a fixed device, such as such as a base transceiver station or a Femtocell, a desktop computer, or a set top box, which may send or receive data to the DCR 110.

The communication tower 140 may be any structure on which the DCR 110 may be mounted. In other embodiments of the wireless communication system 100, the communication tower 140 may be replaced by a building, other types of towers, e.g. water towers, or other structures suitable for mounting the DCR 110. Additionally, the communication tower 140 may connect the DCR 110 to the modem 120, and as such may provide communications between the two.

The DCR 110 may comprise a transmitter, such as a baseband transmitter configured to implement at least one cellular communications standard, such as CDMA, GSM, UMTS, or WiMAX. The transmitter may comprise a PA that amplifies a signal before transmission, in addition to a modulation subsystem, frequency translation subsystem, or combinations thereof. The PA may be coupled to at least one linearizer configured to compensate for at least some of the distortions introduced in the signal, e.g. nonlinearities in the PA. The linearizer may be a VE linearizer, such as a VE linearizer disclosed in U.S. Provisional Patent Application Ser. No. 60/788,970 filed Apr. 4, 2006 by Peter Z. Rashev, et al. and entitled "Adaptive Look-Up Based Volterra-series Linearization of Signal Transmitters," which is incorporated herein by reference as if reproduced in its entirety. The VE linearizer may be configured to approximate or implement at least one inverse signal model, using a plurality of Volterra series orders or terms, and hence to compensate for signal distortion. The inverse signal models may be implemented using software or firmware. For instance, the inverse signal models may be executed on a field-programmable gate array (FPGA), application specific integrated circuit (ASIC), digital signal processor, microprocessor, or other types of processors. The inverse signal models may be executed on a computer system, such as a personal computer, server, or other computer system.

Figure 2:
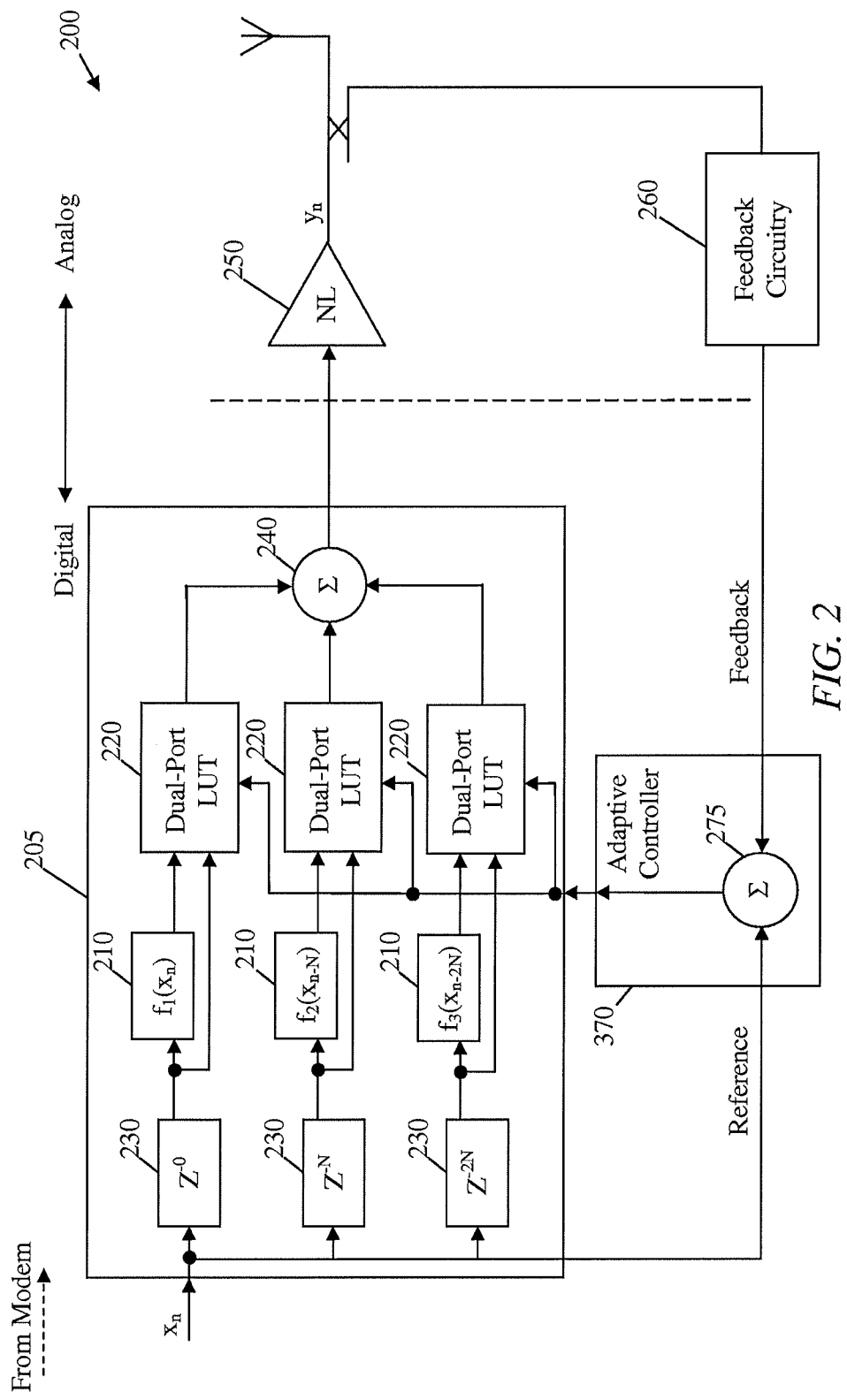
FIG. 2 is a block diagram of an embodiment of a Volterra Engine (VE) based system.

FIG. 2 illustrates an embodiment of a VE based linearizer system 200, which may be used in the transmitter. The VE based linearizer system 200 may comprise a VE linearizer 205 coupled to an amplifier 250. The VE linearizer 205 may comprise a plurality of multipliers 210, which may be coupled to a plurality of real and imaginary dual-port look-up table (LUT) pairs 220, encapsulated in a "dual-port LUT and multiplier" functional blocks. Accordingly, each multiplier may be coupled to a single "dual-port LUT and multiplier" functional block. Additionally, each multiplier 210 may be coupled to a tap-delay line 230. The tap-delay lines 230 may comprise a plurality of delay elements, which may be spaced by a spacing of N samples. Specifically, each delay element ($Z^{-n}$) may designate a propagation delay of n discrete samples, where n is a discrete time index. Each "dual-port LUT and multiplier" functional block 220 may be coupled to one of the tap-delay lines 230 via a multiplier implementing a functional mapping $f_i$ (i=1, 2, 3 . . . ), such as approximating or calculating an input signal or sample delay. The tap-delay line 230 may change a function of a present input sample based on future samples. Hence, the tap-delay elements may form a time axis for the Volterra series, which may comprise a history of the evolution of a waveform, such as a plurality of polynomial functions across time. The outputs of the multipliers 220 and the "dual-port LUT and multiplier" functional block 220 may be added together using a summation block 240 to provide a pre-distorted version of the digital input sample ($x_n$). The pre-distortion digital input sample may then be converted to an analog signal, which may be equivalent to the pre-distortion input signal, using a digital-to-analog converter (DAC) (not shown in the figure). The analog signal may be sent to the amplifier 250, which may be a nonlinear (NL) power amplifier (PA). The analog signal may be up converted to a radio frequency either before inputting the amplifier 250. The amplifier 250 may amplify and transmit the amplified analog signal ($y_n$), for instance using an antenna. The DAC may be coupled to the VE linearizer 205 or the amplifier 250.

Further, a digital feedback signal, which may be a digitized copy of the analog output or transmitted signal, may be provided to the VE linearizer 205 using an analog-to-digital converter (ADC). Specifically, the amplifier 250 may be coupled to a feedback circuitry 260 comprising a feedback receiver and any additional component, such as the ADC, configured to forward the digital feedback signal to an adaptive controller 270, which may be coupled to the VE linearizer 205 and the feedback circuitry 260. The analog output of the amplifier 250 may be down converted from radio frequency to an intermediate frequency or to a baseband frequency before processing by the ADC and/or by the feedback circuitry 260. The adaptive controller 270 may be coupled to or comprise an error block 275, which may receive the feedback signal from the feedback circuitry 260, in addition to a copy of the digital input signal of the VE linearizer 205 or a reference signal. In some embodiments, the error block 275 may be coupled to a propagation delay compensation block (not shown in the figure), which compensates for any delay in the feedback signal before forwarding the reference signal to the error block 275 at the adaptive controller 270. Hence, the error block 275 may use the digital feedback signal and the reference signal to obtain or calculate an error function, which may then be forwarded to the VE linearizer 205 and used to obtain the inverse signal processing model for pre-distortion compensation. Additionally or alternatively, the adaptive controller 270 may comprise at least one signal processing circuitry, which uses the feedback and reference signals to obtain a correction function, which may be forwarded to the VE linearizer 205 and used to obtain the inverse model.

Figure 3:
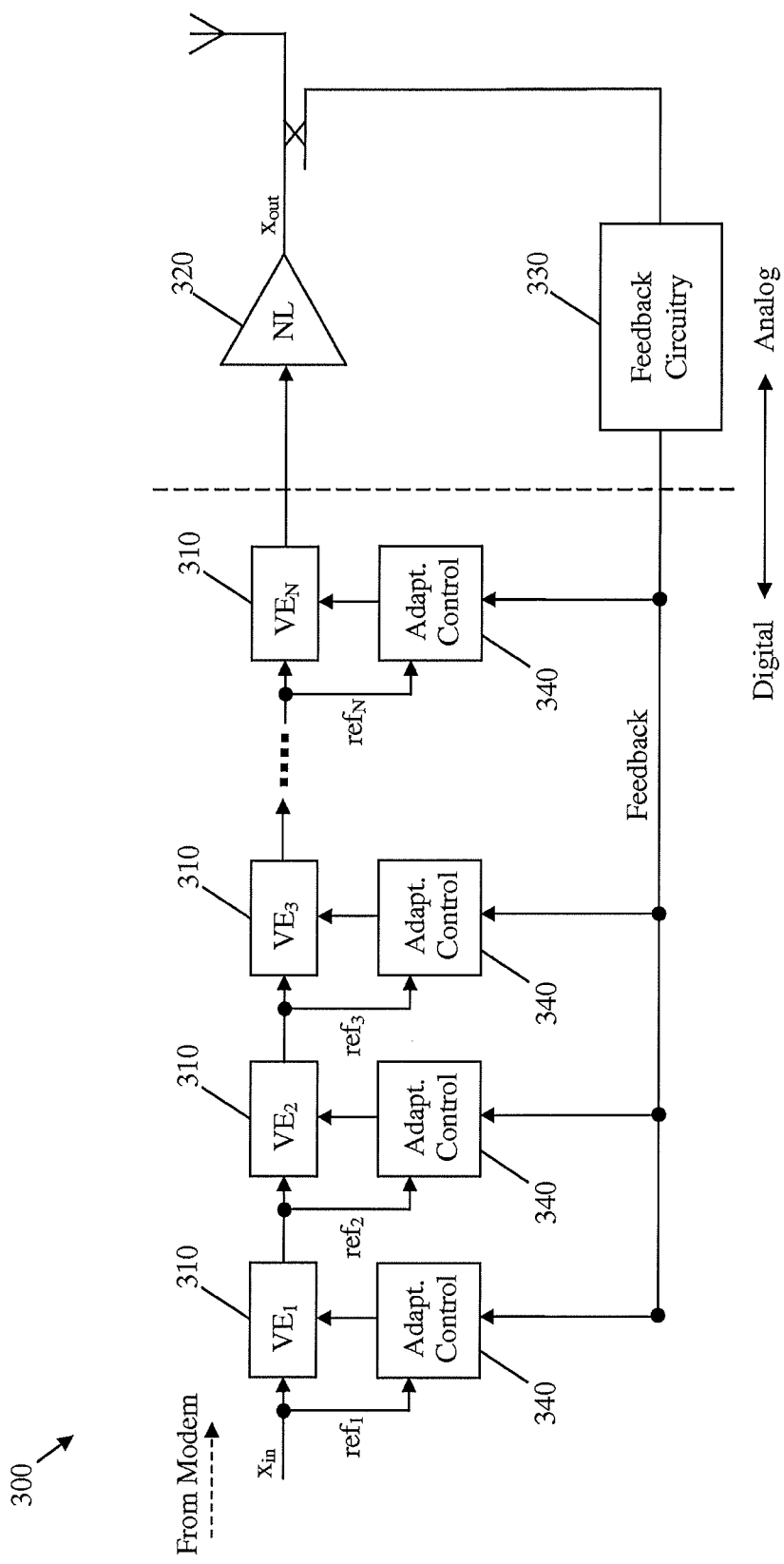
FIG. 3 is a block diagram of an embodiment of a Volterra Engine (VE) series architecture based system.

FIG. 3 illustrates an embodiment of a VE series architecture based system 300 comprising a plurality of VE linearizers 310 ($VE_1, VE_2, VE_3, \ldots, VE_N$), which may be used for a radio based transmitter, wherein the VE linearizers 310 are substantially similar to the VE based linearizers 205 discussed above with reference to FIG. 2. The VE linearizers 310 may be combined in series to provide improved distortion compensation and linearization efficiency in the transmitter. The VE series architecture based system 300 may also comprise an NL PA 320, such as a Doherty or Asymmetrical Doherty amplifier, coupled to the VE linearizers 310 and an antenna or radio transmitter, and a feedback circuitry 330 coupled to the NL PA 320 and to a plurality of adaptive controllers 340. The adaptive controllers 340 may each be coupled to one of the VE linearizers 310. It is understood that the output of the VE linearizers 310 may be up converted to radio frequency before being amplified by the NL PA 320 and that the output of the NL PA 320 may be down converted to one of intermediate frequency and baseband frequency before processing by the feedback circuitry 330.

The VE series architecture based system 300 may receive an input signal $x_{in}$, which may be digital, from a modem, such as the modem 120. The input signal may then be sent to the VE linearizers 310, and then forwarded between the VE linearizers in the series in a sequential manner. As such, each VE linearizer may process the received input signal and forward the processed signal to the next VE linearizer 310. The VE linearizers 310 may be configured as described above, where each VE linearizer 310 may implement an inverse signal model, which may be similar or different from at least some of the remaining VE linearizers 310.

The feedback circuitry 330 may be configured as described above to forward a feedback signal to the adaptive controllers 340. The feedback signal may be digital and provide a digitized copy of an analog output signal $x_{out}$ of the NL PA 320. The VE series architecture based system 300 may comprise a plurality of additional ADC and DAC circuits (not shown in the figure). For instance, a DAC circuit may be coupled to the VE linearizers 310 and the NL AP 320 to convert a digital signal from the VE linearizers 310 into an analog signal, which may then be received by the NL AP 320. Additionally, an ADC circuit may be coupled to the NL PA 320 and the feedback circuitry 330 to convert the analog output signal into digital waveform, which may be processed by the feedback circuitry 330. In another embodiment, the feedback circuitry 330 may process the analog output signal and forward an analog feedback signal to the adaptive controllers 340. Accordingly, at least one ADC circuit may be coupled to the feedback circuitry 330 and the adaptive controllers 340 to convert the analog feedback signal into a digital feedback signal, which may be processed by the adaptive controllers 340.

The adaptive controllers 340 may be configured as described above to receive the feedback signal from the feedback circuitry 330 and a plurality of reference signals ($ref_1$, $ref_2$, ..., $ref_3$, $ref_N$), which may be different. Specifically, each adaptive controller 340 may receive a reference signal associated with the input signal of the corresponding VE linearizer 310 coupled to the adaptive controller. Accordingly, each adaptive controller 340 may use the same feedback signal and the separate reference signal associated with the VE linearizer 310 to obtain an error or correction function, which may vary from one adaptive controller 340 to another. The adaptive controller 340 may forward the error or correction function to the VE linearizer 310, which may use the error or correction function to process the received input signal before forwarding the processed signal to the next VE linearizer 310 in the series.

Combining the VE linearizers 310 in series may improve linearization efficiency and distortion compensation by providing staged correction, where at least one preceding VE linearizer 310 in the series may account or compensate for at least one aspect of distortion or nonlinearity in the signal, while at least one subsequent VE linearizer 310 may account for at least another aspect. For example, one of the VE linearizers 310 may be used for signal linearization, while a subsequent VE linearizer 310 may be used for linear equalization in the signal. Additionally, one of the VE linearizers 310 may be used for memory nonlinear correction, while a subsequent VE linearizer 310 may be used for memoryless nonlinear correction.

The series of VE linearizers 310 may also be used to implement more complex inverse models in comparison to a single integrated or a random architecture with a comparable number of VE components or blocks, such as the VE linearizer 205, or comparable cost. Such VE series architecture may be used with advanced PAs, such as Doherty or Asymmetrical Doherty amplifiers, to support signal formats for G4+ cellular standards or other wireless communications standards, and improve over all system performance and robustness.

Specifically, combining the VE linearizers 310 in series may provide a convolution effect to signal processing, and hence provide improved complex modeling. In addition to attaining increased model complexity, the VE linearizers 310 in series provide a more efficient convolved Volterra-series model, which may require less adaptive components in comparison to non-convolved models of similar modeling capability. Consequently, with less adaptive components, numerical errors and instabilities in transmission systems may be reduced. For instance, a complex distortion behavior may be modeled as a series of subsequent less complex distortion behaviors, which may be each accounted for efficiently by a dedicated VE linearizer in the series.

Further, improving complex modeling may also improve design simplicity, for example by replacing a complex VE linearizer with a plurality of simpler VE linearizers, and hence reduce cost. Further, such architecture may require no or minimum synchronization or control, since the input signal may be transported or forwarded between the VE linearizers in the series without the need for additional signal processing, for instance using timing or filtering blocks.

Figure 4:
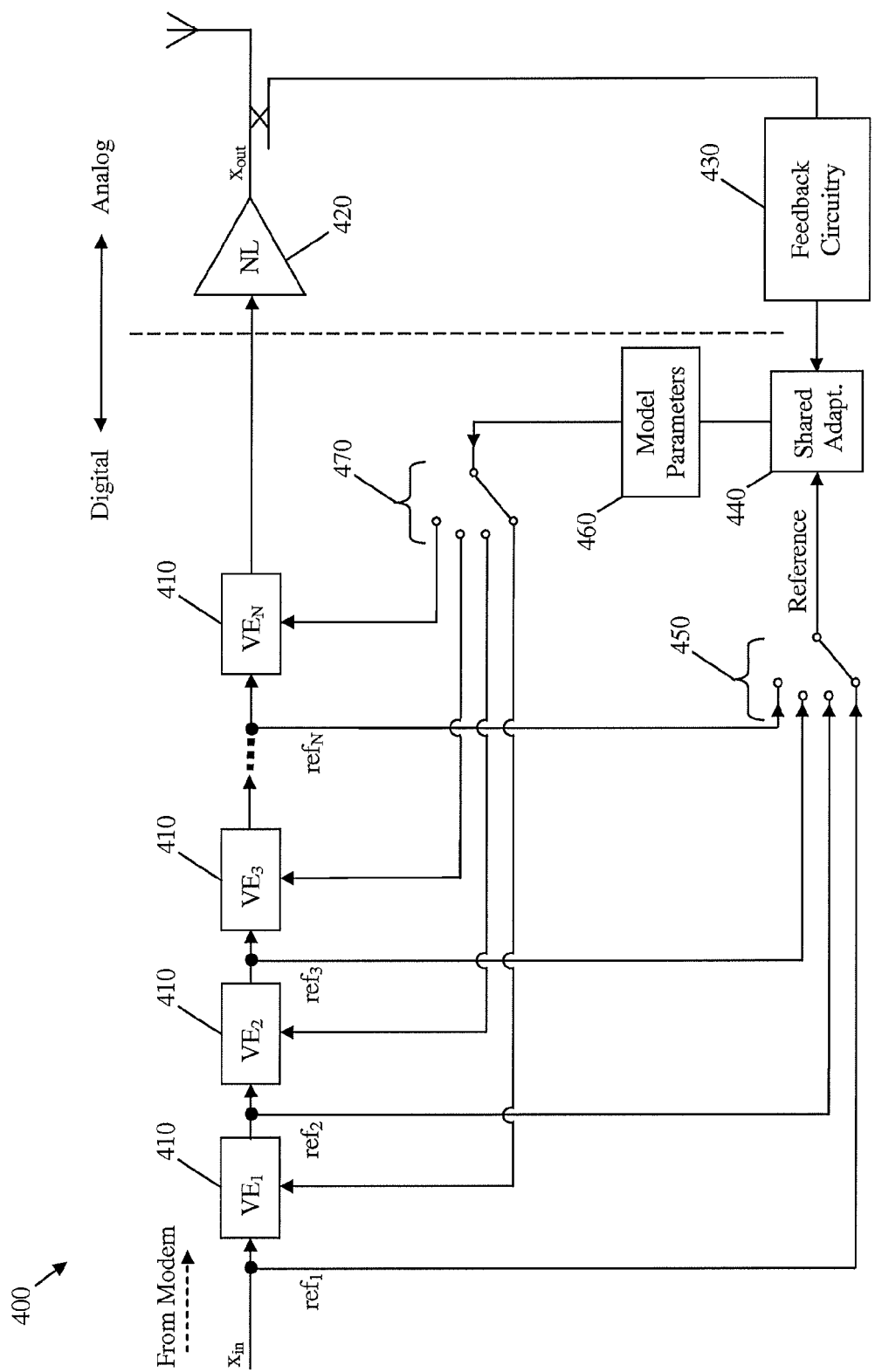
FIG. 4 is a block diagram of another embodiment of a VE series architecture based system.

FIG. 4 illustrates another embodiment of a VE series architecture based system 400 comprising a plurality of VE linearizers 410 in series, an NL PA 420, and a feedback circuitry 430, wherein the VE linearizers 410 are substantially similar to the VE based linearizers 205 discussed above with reference to FIG. 2. It is understood that the output of the VE linearizers 410 may be up converted to radio frequency before being amplified by the NL PA 420 and that the output of the NL PA 420 may be down converted to one of intermediate frequency and baseband frequency before processing by the feedback circuitry 430.

However, the VE series architecture based system 400 may comprise a single shared adaptive controller 440, which may be used to forward a corresponding error or correction function to each VE linearizer 410. Specifically, the shared adaptive controller 440 may be coupled to the feedback circuitry 430, which may send the feedback signal to the shared adaptive controller 440. Additionally, the shared adaptive controller 440 may be coupled to a first switch 450, which may connect to or tap the input signals of the VE linearizers 410, and forward a reference signal associated with the input signals to the shared adaptive controller 440. The shared adaptive controller 440 may be coupled to the VE linearizers 410 via a model parameters module 460 and a second switch 470, which may connect to the VE linearizers.

The first switch 450 and the second switch 470 may connect to the input signals and the VE linearizers 410, respectively, in a synchronous manner. As such, the first switch 450 and the second switch 470 may connect to the pairs of input signals and their corresponding VE linearizers, sequentially one pair at a time. For example, when the first switch 450 couples the reference signal ($ref_1$) of a first VE linearizer 410 ($VE_1$) to the shared adaptive controller 440, the second switch 470 couples the model parameters module 460 to the first VE linearizer 410 ($VE_1$); when the first switch 450 couples the reference signal ($ref_2$) of a second VE linearizer 410 ($VE_2$) to the shared adaptive controller 440, the second switch 470 couples the model parameters module 460 to the second VE linearizer 410 ($VE_2$); etc. The first switch 450 and the second switch 470 may connect to each pair of input signal and VE linearizer 410 at about the same time or at an appropriate delay between tapping the input signal and connecting to the corresponding VE linearizer 410. Accordingly, at any given time or time period, the shared adaptive controller 440 may receive a single reference signal, use the reference signal and the feedback signal to obtain an error or correction function, and forward the error or correction function to the appropriate VE linearizer 410. Further, the model parameters module 460 may be used to apply the appropriate model parameters, which may be needed to obtain the appropriate error or correction function corresponding to the VE linearizer 410. The model parameters module 460 may apply similar models parameters or different model parameters, for instance depending on the position of the first switch 450 or the second switch 470, to at least some of the VE linearizers 410.

The first switch 450 and the second switch 470 may be controlled automatically, for instance by a programmed software to switch or select the VE linearizers 410 and the corresponding reference signals one at a time in a time sequential manner that matches the sequence of the VE linearizers in the series. The timing of the first switch 450 and the second switch 470 may be controlled and synchronized using additional timing circuitry (not shown in the figure), which may provide smooth transitioning from one VE linearizer 410 to the next VE linearizer 410 in the series with substantially no delays or waits. For instance, a timing circuitry may be used to control the switching rate of the first switch, the second switch 470, or both. Further, the timing of the switch action may be asynchronous to the larger system, and or signal.

Figure 5:
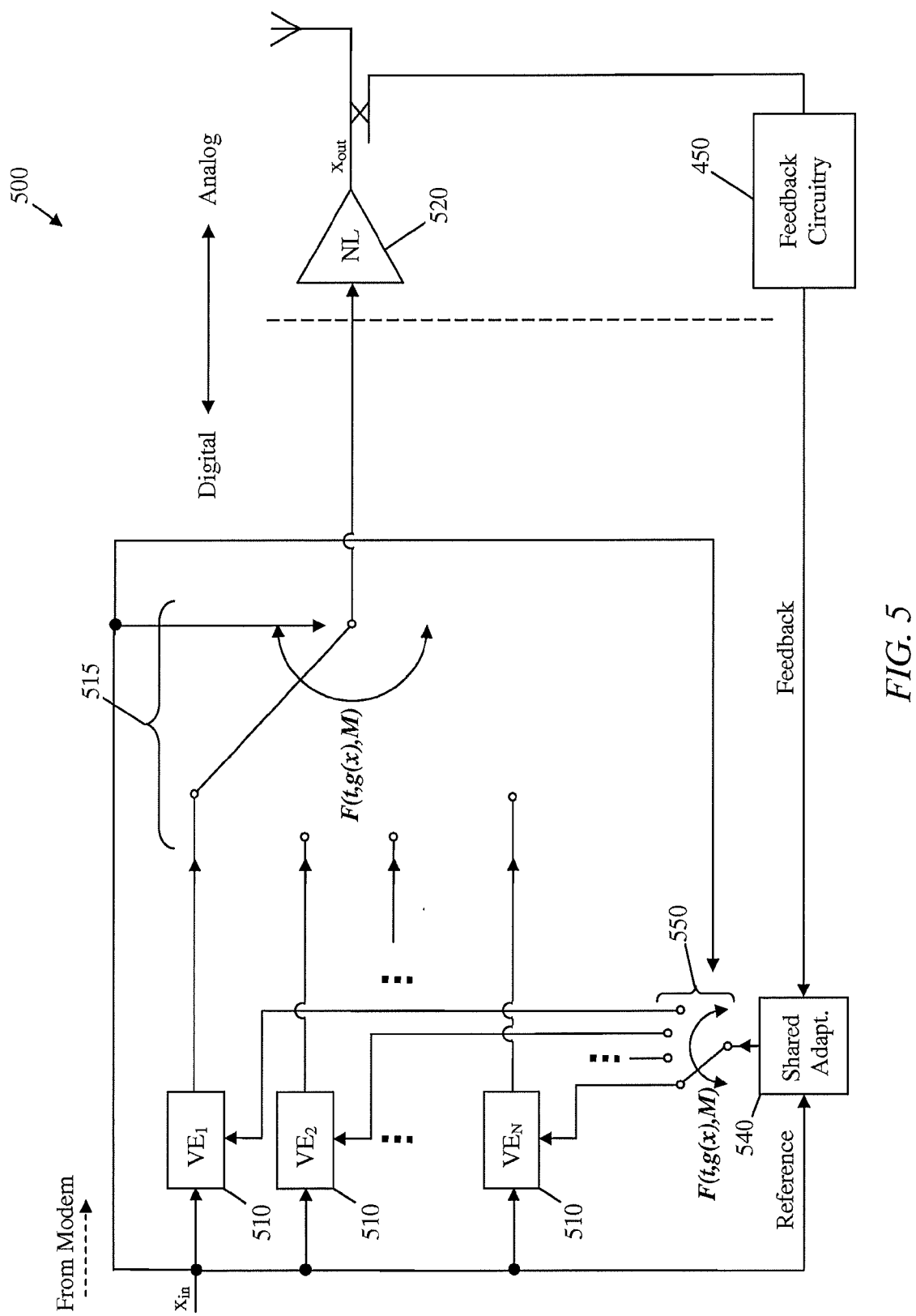
FIG. 5 is a block diagram of an embodiment of a VE parallel architecture based system.

FIG. 5 illustrates an embodiment of a VE parallel architecture based system 500 comprising a plurality of VE linearizers 510 combined in parallel, a first switch 515, an NL PA 520, a feedback circuitry 530, and a shared adaptive controller 540, and a second switch 550, wherein the VE linearizers 510 are substantially similar to the VE based linearizers 205 discussed above with reference to FIG. 2. It is understood that the output of the VE linearizers 510 may be up converted to radio frequency before being amplified by the NL PA 520 and that the output of the NL PA 520 may be down converted to one of intermediate frequency and baseband frequency before processing by the feedback circuitry 530.

However, the shared adaptive controller 540 may be connected to a single shared input signal, instead of a plurality of input signals in the case of the series architecture. Moreover, the shared adaptive controller 540 may use the same reference signal associated with the shared input signal, as well as the feedback signal, to forward an error or correction function to one selected or designated VE linearizer 510.

The error or correction function may be shared for all the VE linearizers 510. The VE linearizer 510 may be selected using the second switch 550, which may be coupled to the shared adaptive controller 540 and may connect to one of the VE linearizers 510 separately at any time. Accordingly, the selected VE linearizer 510 may also be coupled using the first switch 515 to the NL PA 520. In other embodiments, the error or correction function may be obtained using the same reference and feedback signals but using different model parameters, corresponding to the different VE linearizers. For instance, a model parameters module, such as the model parameters module 360, may be coupled to the shared adaptive controller 540 and the second switch 550, and may be used to obtain the model parameters corresponding to the selected VE linearizer 510.

Each VE linearizer 510 may be configured or optimized for improved linearization efficiency for a designated signal aspect or characteristic, such as a frequency range, a signal level, a bandwidth range, a gain, or amplification. The VE linearizers 510 may also be configured or optimized for different signal types, formats, or modulations, which may be applied over time. As such, the second switch 550 may be preprogrammed to switch the VE linearizers 510 over a plurality of dynamic range spans, e.g., varying frequency or gain spans, or over time, where a plurality of different signal formats are applied. For instance, the VE linearizers 510 may be switched based on a predetermined function of frequency, power, time, or combinations thereof to guarantee efficient compensation for non-static PAs or medium-term thermal transients. Examples of applications which may benefit from dynamic switching between optimized VE linearizers may include PA linearization for Time-Division Duplex (TDD), and time varying framing for TDD and Frequency Division Duplex (FDD).

The second switch 550 may be controlled using additional timing circuitry (not shown in the figure), which may provide synchronization between the flow of input, feedback, and reference signals and the dynamic switching time to prevent signal delays or errors. For instance, the second switch 550 may be controlled to switch or select a VE linearizer 510 at about the same time or at a short time in advance, before the arrival of the corresponding input signal to the VE linearizer 510. In another embodiment, the VE linearizers 510 may be switched by an operator based on the input signal frequency range, power or level range, or based on a timing sequence or time schedule.

Further, the VE linearizers 510 may be witched or selected, using the second switch 550, at about equal delay time and without substantial synchronization for each switched VE linearizer 510. For instance, each VE linearizer 510 may be switched to receive a similar data stream of signals and at about an equal switching delay time as the remaining VE linearizers 510. Accordingly, dynamic switching between the VE linearizers 510 may be transient free, i.e., without transient impacts.

Figure 6:
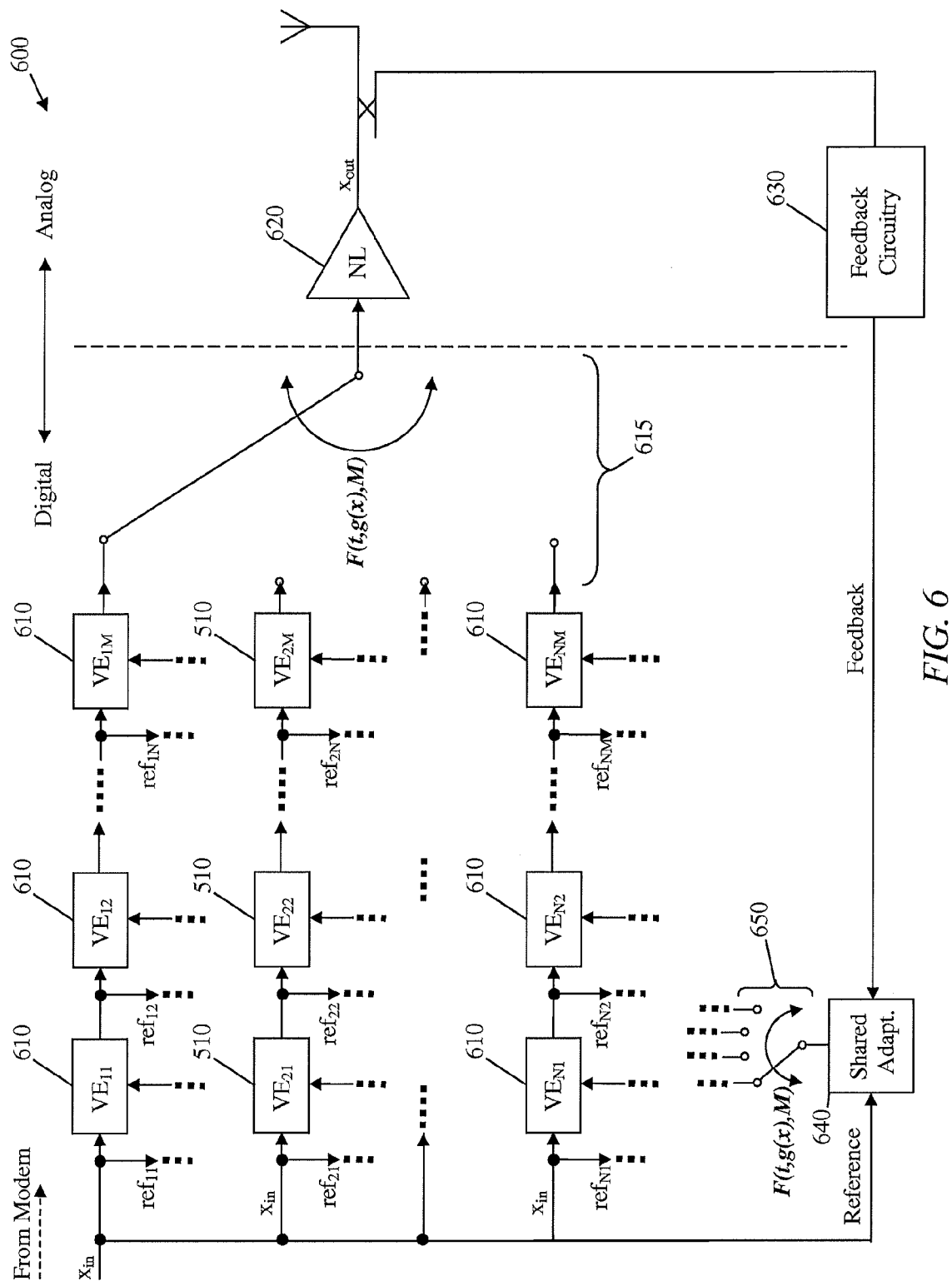
FIG. 6 is a block diagram of an embodiment of a VE combined architecture based system.

FIG. 6 illustrates an embodiment of a VE combined architecture based system 600, which may comprise the combined advantages or characteristics of a VE series architecture, such as systems 300 or 400, and a VE parallel architecture, such as the system 500. The VE combined architecture based system 600 may comprise a plurality of VE linearizers 610 coupled in series, in parallel, or combinations thereof. Additionally, the VE combined architecture based system may comprise a first switch 615, an NL PA 620, a feedback circuitry 630, a shared adaptive controller 640, and a second switch 650, which may be configured similar to their corresponding components described above. The VE linearizers 610 are substantially similar to the VE based linearizers 205 discussed above with reference to FIG. 2. It is understood that the output of the VE linearizers 610 may be up converted to radio frequency before being amplified by the NL PA 620 and that the output of the NL PA 620 may be down converted to one of intermediate frequency and baseband frequency before processing by the feedback circuitry 630.

The shared adaptive controller 640 may receive and use the same reference and feedback signals to obtain an error or correction function. The shared adaptive controller 640 may send the error or correction function to one of a plurality of series of VE linearizers 610. Additionally, the VE combined architecture based system 600 may comprise a plurality of switches and timing circuitry (not shown in the figure), which may be required to synchronize the flow of signals based on the architecture or arrangement of the VE linearizers 610.

The series of VE linearizers 610 may be arranged in parallel, where each series of VE linearizers 610 may be configured or optimized for improved linearization efficiency over a designated frequency range, bandwidth range, over time, or other signal property, similar to the system 500. Further, each series may comprise a plurality of VE linearizers, which may be staged or aligned in sequence to improve linearization efficiency and complex modeling, similar to systems 300 or 400. The VE linearizers 610 may be separate components or may be integrated to obtain a combined VE linearizer with improved distortion compensation and design simplicity. In some embodiments, each VE linearizer 610 may further comprise a plurality of integrated VE linearizers, which may be combined in series, in parallel, or both.

Figure 7:
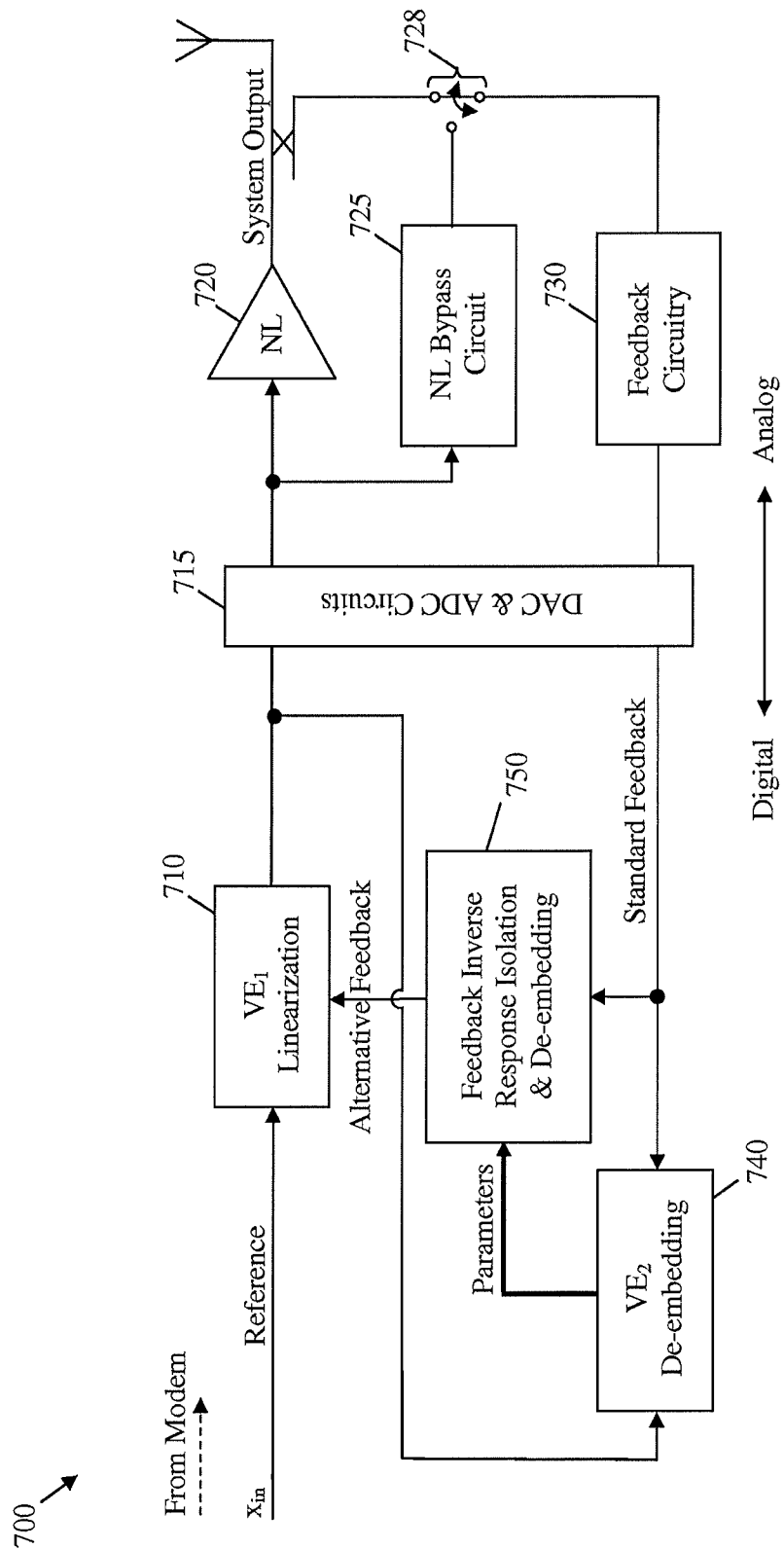
FIG. 7 is a block diagram of an embodiment of a VE de-embedding based system.

FIG. 7 illustrates one embodiment of a VE de-embedding based system 700, which may use a plurality of integrated or combined VE linearizers to further improve distortion compensation and linearization efficiency. The VE de-embedding based system 700 may comprise a first VE linearizer 710, a DAC and ADC circuits block 715, an NL PA 720, an NL bypass circuit 725, a switch 728, a feedback circuitry 730, a second VE linearizer 740, and a "feedback inverse response isolation and de-embedding" block 750. The VE linearizers 710, 740 are substantially similar to the VE based linearizers 205 discussed above with reference to FIG. 2. It is understood that the output of the DAC and ADC circuits block 715 may be up converted to radio frequency before being amplified by the NL PA 720 and that the output of the NL PA 720 may be down converted to one of intermediate frequency and baseband frequency before processing by the feedback circuitry 730.

The VE de-embedding based system 700 may also comprise a plurality of adaptive controllers (not shown in the figure), which may be associated with the first VE linearizer 710, the second VE linearizer 750, or shared between the first VE linearizer 710 and the second VE linearizer 750. The DAC and ADC circuit block 715 may be coupled to the first VE linearizer 710 and the second VE linearizer 740, which may process digital signals, and to the NL PA 720 and the feedback circuitry 730, which may process analog signals. Accordingly, the DAC and ADC circuit 715 may implement necessary signal conversions (between digital and analog waveforms) for the system output and the feedback signals.

The first VE linearizer 710 and the second VE linearizer 740 may each be a combined VE linearizer comprising a plurality of integrated VE linearizers, which may be coupled in series, in parallel, or both. However, the first VE linearizer 710 may be optimized to linearize the output signal, for instance compensate for amplification distortion, while the second VE linearizer 740 may be optimized to de-embed a signal distortion introduced by the feedback circuitry 730. De-embedding a signal characteristic response from a total signal response, such as feedback distortion from remaining signal distortions, may comprise obtaining specific model parameters associated with that signal characteristic, for instance by isolating the signal characteristic response from the remaining signal responses and using inverse modeling. The model parameters specific to the signal characteristic may then be processed to obtain an error function, which may be subtracted from the total signal response.

De-embedding the feedback signal distortion may be employed to avoid introducing additional errors to the linearization models, for instance when obtaining the error or correction function based on the distorted feedback signal. Hence, de-embedding the feedback signal distortion may further improve the linearization efficiency as well as overall system performance.

In an embodiment, the switch 728 may connect to the bypass circuit 725 to bypass the amplified output signal and send instead a pre-distorted output signal (prior to amplification) to the feedback circuitry 730. As such, the switch 728 may be used to substantially eliminate amplification distortion, such as NL distortion, introduced by the NL PA 720, and hence allow the second VE linearizer 740 to model the response of the feedback circuitry 730 including feedback distortion without substantial impairments from the NL PA 720. The second VE linearizer 740 may receive the feedback signal from the feedback circuitry, which may comprise substantially feedback distortion without amplification distortion. Additionally, the second VE linearizer 740 may receive an output signal from the first VE linearizer 710 comprising substantially no distortions Feedback or amplification distortions. The second VE linearizer 740 may use the output signal and the feedback signal to model a plurality of feedback distortion parameters, which may be sent to the "feedback inverse response isolation and de-embedding" block 750. Specifically, since the second VE linearizer 740 is optimized to compensate for feedback distortions without other distortions, the second VE linearizer 740 may accurately model the inverse response of the feedback circuitry 730, and forward the model parameters to the "feedback inverse response isolation and de-embedding" block 750.

The "feedback inverse response isolation and de-embedding" block 750 may then use the model parameters to de-embed the feedback distortion from the feedback signal and obtain an alternative feedback signal substantially free of feedback distortion, which may be sent to the first VE linearizer 710. Once, the model parameters are obtained, the switch 728 may connect to and forward the amplified output signal to the feedback circuitry 730. The feedback circuitry 730 may then send the feedback signal comprising feedback distortion, amplification distortion, other signal distortions, or combinations thereof. The feedback distortion may be eliminated or reduced at the "feedback inverse response isolation and de-embedding" block 750 using the model parameters, while the remaining signal distortions may be compensated at the first VE linearizer 710. In an alternative embodiment, instead of bypassing the amplified output signal using the switch 728, feedback distortion may be isolated mathematically or using digital signal processing. For instance, a dedicated modeling circuitry or software may be used to subtract system distortion related to amplification from the feedback signal. Hence, the resulting feedback signal may be sent with any feedback distortion to the second VE linearizer 740.

Figure 8:
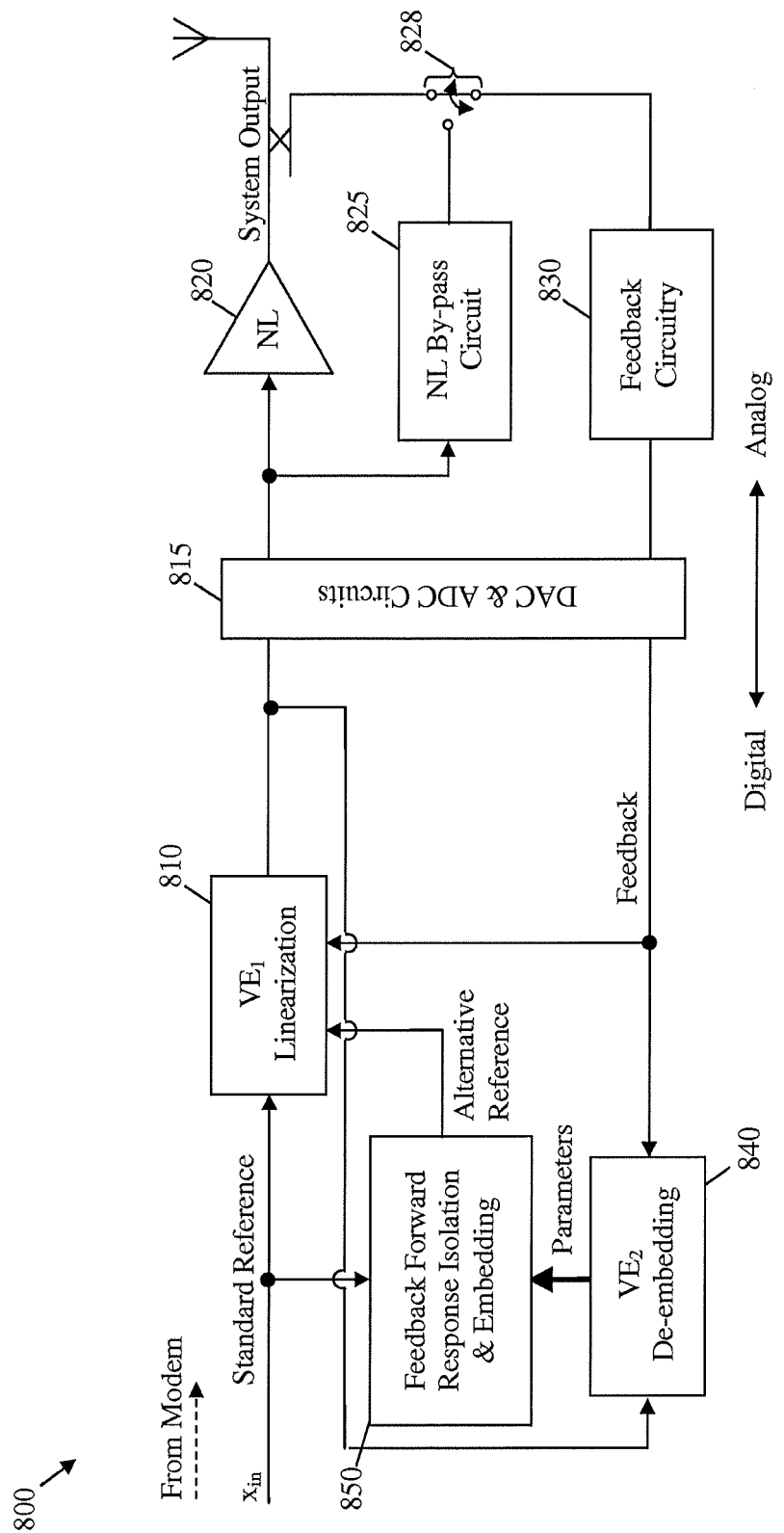
FIG. 8 is a block diagram of another embodiment of a VE de-embedding based system.

FIG. 8 illustrates another embodiment of a VE de-embedding based system 800, which may be used for de-embedding feedback distortion. The VE de-embedding based system 800 may comprise a first VE linearizer 810, a DAC and ADC circuits block 815, an NL PA 820, an NL bypass circuit 825, a switch 828, a feedback circuitry 830, and a second VE linearizer 840, which may be configured similar to the corresponding components of the system 700. The VE linearizers 810, 840 are substantially similar to the VE based linearizers 205 discussed above with reference to FIG. 2. It is understood that the output of the DAC and ADC circuits block 815 may be up converted to radio frequency before being amplified by the NL PA 820 and that the output of the NL PA 820 may be down converted to one of intermediate frequency and baseband frequency before processing by the feedback circuitry 830.

However, the VE de-embedding based system 800 may comprise a "feedback forward response isolation and embedding" block 850, instead of the "feedback inverse response isolation and de-embedding" block 750, and may use an alternative reference signal instead of an alternative feedback signal to compensate for and de-embed feedback distortions. The VE de-embedding based system 800 may model a feedback forward response, i.e., the response of the feedback circuitry 830, which may then be embedded into the reference signal of the first VE linearizer 810. As such, feedback distortions may be excluded or substantially removed from the calculated error function forwarded to the first VE linearizer 810. Hence, the first VE linearizer 810 may linearize the signal using the error function, based on the reference signal including feedback distortion, without compensating directly for feedback distortion. Accordingly, the first VE linearizer 810 and the second VE linearizer 840, may be configured different to the first VE linearizer 710 and the second VE linearizer 740, respectively. For instance the first VE linearizer 810 and the second VE linearizer 840 may comprise a different number of embedded VE linearizers or different architectures.

Specifically, a feedback signal, comprising substantially feedback distortion without amplification distortion, may be obtained using the switch 828 or mathematically as described above. The feedback signal may be forwarded to both the first VE linearizer 810 and the second VE linearizer 840. The second VE linearizer 840 may use the feedback signal, in addition to an output signal from the first VE linearizer 810, comprising substantially no feedback or amplification distortions, to obtain the feedback distortion parameters. The second VE linearizer 840 may then send the feedback distortion parameters to the "feedback forward response isolation and embedding" block 850. The "feedback forward response isolation and embedding" block 850 may also receive a reference signal corresponding to the input signal of the first VE linearizer 810. The "feedback forward response isolation and embedding" block 850 may use the feedback distortion parameters and the reference signal to obtain the alternative reference signal, which may comprise errors or impairments that counters the feedback distortion. For instance, the difference or error between the reference signal and the feedback signal may be approximated at the "feedback forward response isolation and embedding" block 850. The first VE linearizer 810 may then use the approximated difference or error to compensate for other system distortions, while countering or canceling the effects of the feedback distortion as observed at the system output.

Figure 9:
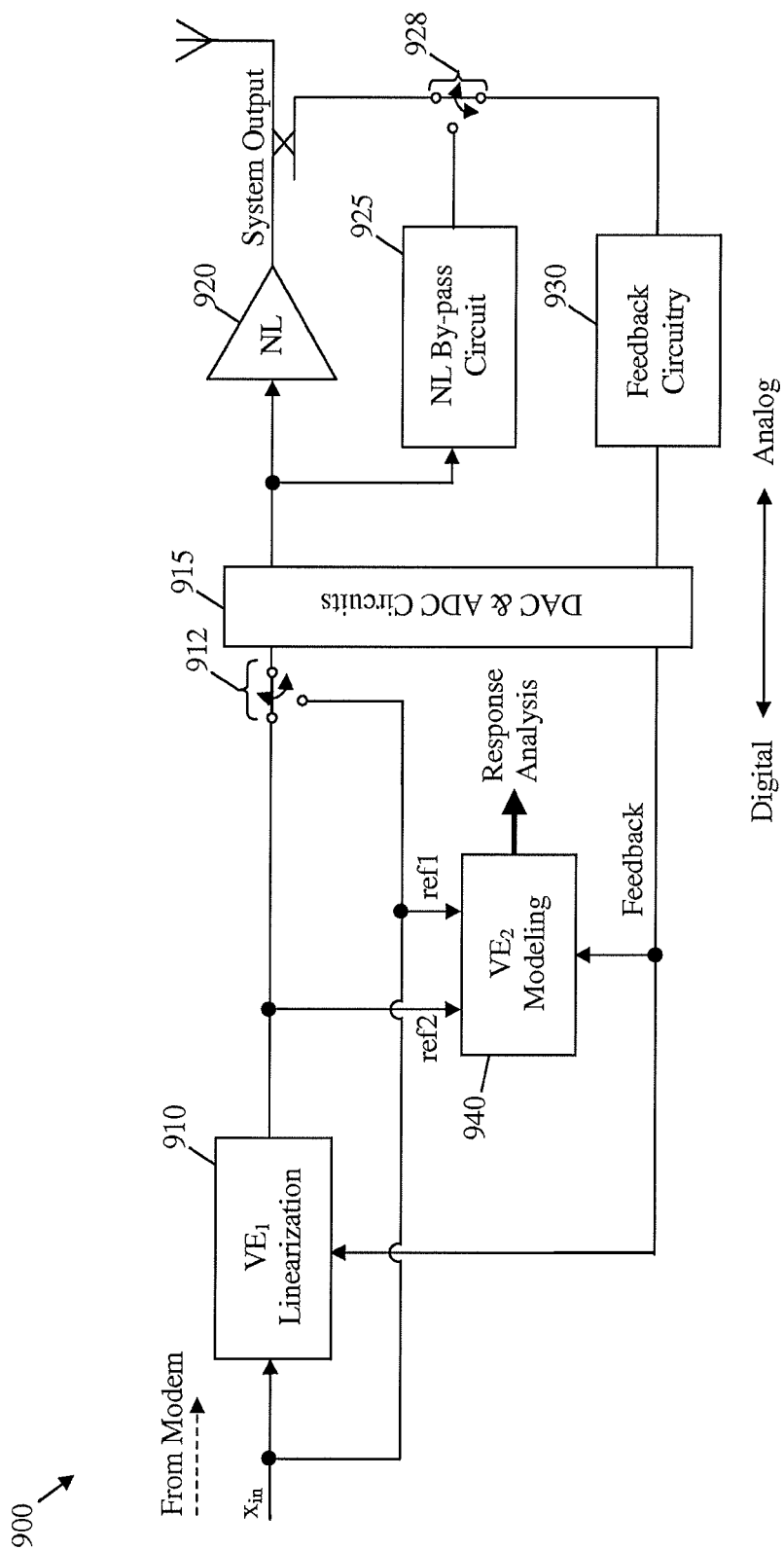
FIG. 9 is a block diagram of an embodiment of a VE modeling based system.

FIG. 9 illustrates an embodiment of a VE modeling based system 900, which may be used for modeling a plurality of system distortions. The VE modeling based system 900 may comprise a first VE linearizer 910, a first switch 912 coupled to the first VE linearizer 910, a DAC and ADC circuits block 915, an NL PA 920, an NL bypass circuit 925, a second switch 928, and a feedback circuitry 930, which may be configured similar to the corresponding components of the systems 700 or 800. The VE linearizer 910 is substantially similar to the VE based linearizers 205 discussed above with reference to FIG. 2. It is understood that the output of the DAC and ADC circuits block 915 may be up converted to radio frequency before being amplified by the NL PA 920 and that the output of the NL PA 920 may be down converted to one of intermediate frequency and baseband frequency before processing by the feedback circuitry 930.

Additionally, The VE modeling based system 900 may comprise a second VE linearizer 940. The second VE linearizer 940 may be used to model at least one system response to no distortion, feedback distortion, amplification distortion, other system distortions, or combinations thereof, which may be introduced in the system 900. As such, the model parameters of the second VE linearizer 940 may not be used in a direct manner to adjust or de-embed the system responses. Instead, the second VE linearizer 940 may be used to provide system response parameters, which may be useful for analyzing overall system performance, allocating system deficiencies, and planning or designing for system upgrades.

For instance, the second VE linearizer 940 may model the response of the system, when the second switch 928 connects to the amplified output signal and the first switch 912 connects to the output of the first VE linearizer 910 (as shown in the figure). As such, the second VE linearizer 940 may model the system response after linearization. The second VE linearizer 940 may also model the response of the system before linearization when the first switch 912 connects to a reference of the input of the first VE linearizer 910. The two responses, prior and after linearization, may then be compared to analyze the linearization efficiency of the first VE linearizer 910 to compensate for different system distortions.

In another modeling scenario, the second VE linearizer 940 may model a distorted feedback signal, when the second switch 928 bypasses the amplified output signal and the first switch 912 connects to the input of the first VE linearizer 910. The second VE linearizer 940 may also model the system response to an isolated feedback signal when the first switch 912 connects to the output of the first VE linearizer 910. The system response to the isolated feedback signal may be compared to the feedback distortion model to assess the efficiency of the first VE linearizer 910 in compensating for feedback distortion, and overall end-to-end transmitter system performance. In other embodiments, the second VE linearizer 940 may model a plurality of system responses to analyze the efficiency of the first VE linearizer 910 in compensating for a plurality of signal distortions, when different de-embedding techniques are applied, such as described above.

Figure 10:
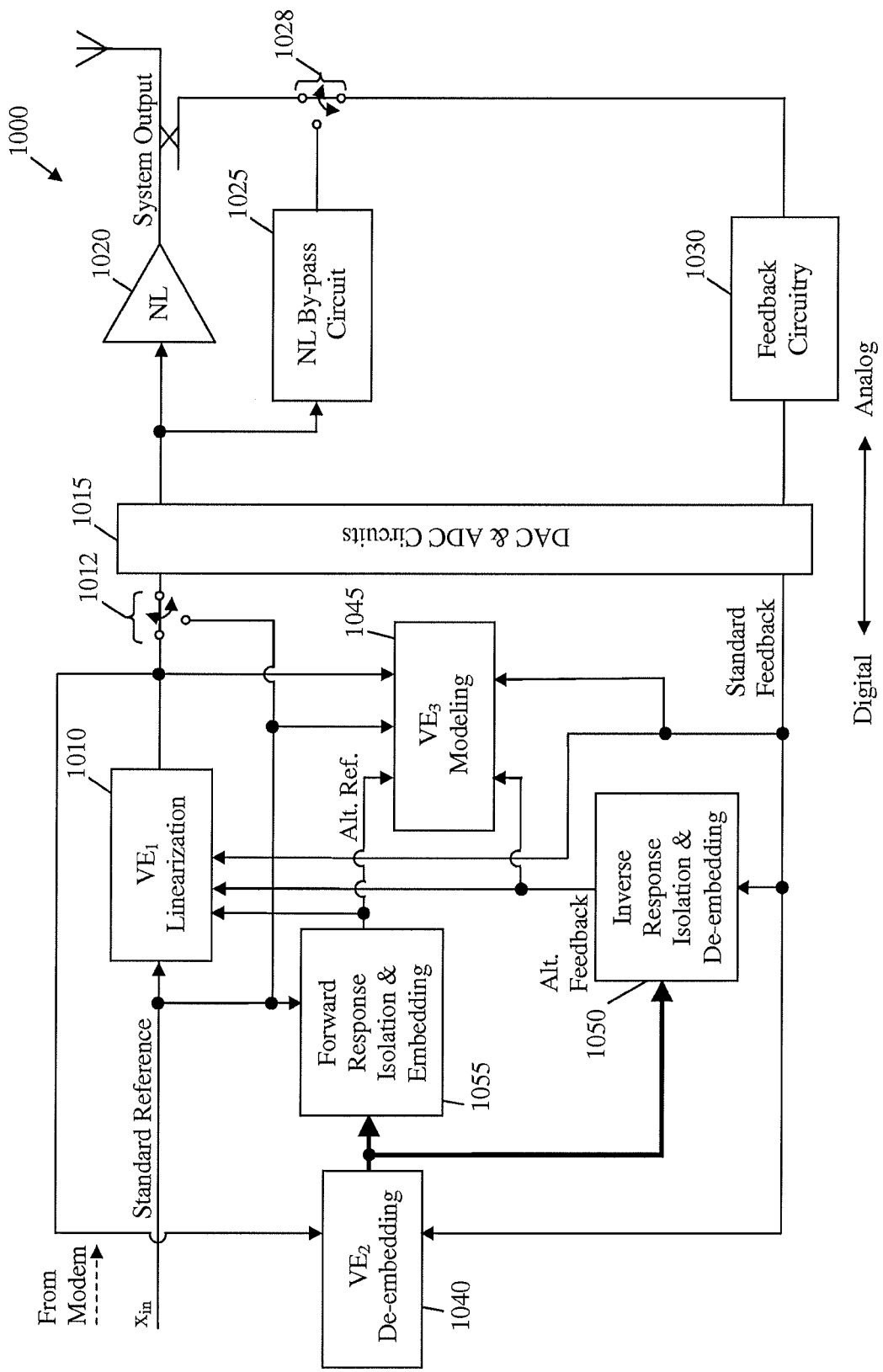
FIG. 10 is a block diagram of an embodiment of a VE de-embedding and modeling based system.

FIG. 10 illustrates an embodiment of a VE de-embedding and modeling based system 1000, which may comprise the combined advantages or characteristics of a VE de-embedding based system, such as systems 700 or 800, and a VE modeling based system, such as the system 900.

The de-embedding and modeling based system 1000 may comprise a first VE linearizer 1010 optimized for linearization and distortion compensation, a first switch 1012, a DAC and ADC circuits block 1015, an NL PA 1020, an NL bypass circuit 1025, a second switch 1028, and a feedback circuitry 1030, which may be configured similar to the corresponding components of the systems 600 or 700. It is understood that the output of the DAC and ADC circuits block 1015 may be up converted to radio frequency before being amplified by the NL PA 1020 and that the output of the NL PA 1020 may be down converted to one of intermediate frequency and baseband frequency before processing by the feedback circuitry 1030. Additionally. The VE modeling based system 1000 may comprise a second VE linearizer 1040 optimized for de-embedding feedback distortion, a third VE linearizer 1045 optimized for modeling system responses, a "feedback inverse response isolation and de-embedding" block 1050, and a "feedback inverse response isolation and embedding" block 1055, which may be configured similar to the corresponding components above. The VE linearizers 1010, 1040, 1045 are substantially similar to the VE based linearizers 205 discussed above with reference to FIG. 2.

The system 1000 may provide improved linearization efficiency and distortion compensation directly, via linearization and de-embedding using the first VE linearizer 1010 and the second VE linearizer 1040, or indirectly, via modeling using the third VE linearizer 1045. In other embodiments of the VE de-embedding and modeling based system 1000, a combined VE linearizer may comprise the first VE linearizer 1010, the second VE linearizer 1040, and the third VE linearizer 1045, which may be coupled to each other in addition to any other required circuitries, switches, or blocks. Alternatively, the combined VE linearizer may comprise at least some of the embedded VE linearizers in the first VE linearizer 1010, the second VE linearizer 1040, and the third VE linearizer 1045, which may be rearranged in series, in parallel, or both.

Figure 11:
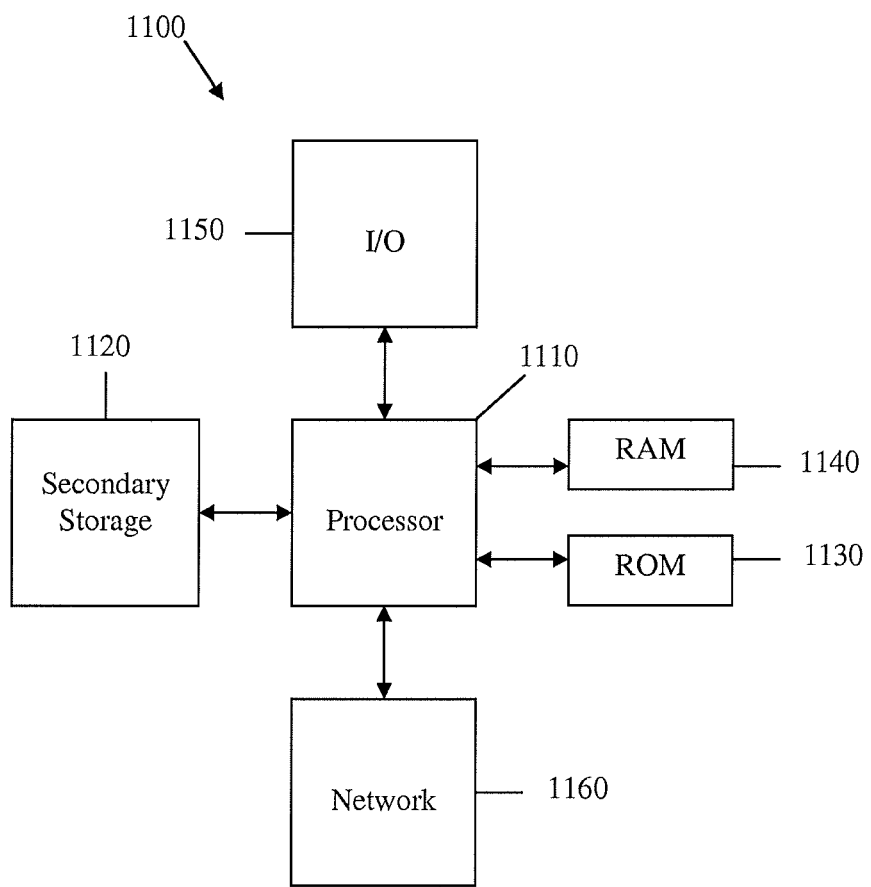
FIG. 11 is an illustration of an embodiment of a general-purpose computer system.

At least some of the system components described above, such as a component of a VE linearizer, may be implemented on any general-purpose network component, such as a computer or network component with sufficient processing power, memory resources, and network throughput capability to handle the necessary workload placed upon it. FIG. 11 illustrates a typical, general-purpose network component 1100 suitable for implementing one or more embodiments of the components disclosed herein. The network component 1100 includes a processor 1110 (which may be referred to as a central processor unit or CPU) that is in communication with memory devices including secondary storage 1120, read only memory (ROM) 1130, random access memory (RAM) 1140, input/output (I/O) devices 1150, and network connectivity devices 1160. The processor 1110 may be implemented as one or more CPU chips, or may be part of one or more ASICs.

The secondary storage 1120 is typically comprised of one or more disk drives or tape drives and is used for non-volatile storage of data and as an over-flow data storage device if RAM 1140 is not large enough to hold all working data. Secondary storage 1120 may be used to store programs that are loaded into RAM 1140 when such programs are selected for execution. The ROM 1150 is used to store instructions and perhaps data that are read during program execution. ROM 1150 is a non-volatile memory device that typically has a small memory capacity relative to the larger memory capacity of secondary storage 1120. The RAM 1140 is used to store volatile data and perhaps to store instructions. Access to both ROM 1130 and RAM 1140 is typically faster than to secondary storage 1120.

Additionally, at least some or all of the system components described can be implemented in a single or multiple FPGAs (Field Programmable Gate Arrays) and/or ASICs (Application Specific Integrated Circuits). For instance, at least some of the system components may be implemented in FPGAs using point-by-point methods, instead of block based methods using a microprocessor. However, other embodiments may comprise internally integrated CPU or external chip CPU.

While preferred embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.), Use of the term "optionally" with respect to any element of a claim is intended to mean that the subject element is not required. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the preferred embodiments of the present invention. The discussion of a reference in the Description of Related Art is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

What is claimed is:

1. A signal distortion compensation system comprising:
   a first Volterra Engine (VE) linearizer;
   a second VE linearizer coupled to the first VE linearizer; and
   means for providing a feedback signal to the second VE linearizer,
   wherein the first VE linearizer is configured to linearize and reduce distortion in an output signal, and the second VE linearizer is optimized to de-embed feedback distortion in the feedback signal.

2. The signal distortion compensation system of claim 1 further comprising:
   a power amplifier (PA) coupled to the first VE linearizer;
   a nonlinear (NL) bypass circuit configured to receive a non-amplified output of the first VE linearizer, and
   a switch coupled to the means for providing the feedback signal to the second VE linearizer,
   wherein the feedback signal comprises feedback distortion without substantial amplification distortion when the switch connects the means for providing the feedback signal to the second VE linearizer to the NL bypass circuit, and wherein the feedback signal comprises feedback distortion and amplification distortion when the switch connects the means for providing the feedback signal to the second VE linearizer to the PA.

3. The signal distortion compensation system of claim 2 further comprising:
   a DAC and ADC circuits block that converts the non-amplified output of the first VE linearizer from a digital waveform to an analog waveform and converts the feedback signal from an analog waveform into a digital waveform.

4. The signal distortion compensation system of claim 1, wherein amplification distortion is isolated from the feedback signal based upon digital signal processing.

5. The signal distortion compensation system of claim 1 further comprising:
   a feedback inverse response isolation and de-embedding block coupled to the first VE linearizer, the second VE linearizer, and the means for providing the feedback signal to the second VE linearizer,
   wherein the feedback inverse response isolation and de-embedding block is configured to send an alternative feedback signal comprising substantially no feedback distortion to the first VE linearizer, wherein the alternative feedback signal is obtained based upon model parameters from the second VE linearizer.

6. The signal distortion compensation system of claim 1 further comprising:
   a feedback forward response isolation and embedding block coupled to the first VE linearizer and the second VE linearizer,
   wherein the feedback forward response isolation and embedding block is configured to send an alternative reference signal to the first VE linearizer to counter distortion feedback in the feedback signal, wherein the alternative reference signal is obtained based upon model parameters from the second VE linearizer.

7. The signal distortion compensation system of claim 1 further comprising:
   a nonlinear (NL) bypass circuit configured to receive a non-amplified output of the first VE linearizer;
   a power amplifier (PA) coupled to the first VE linearizer;
   a first switch coupled to the PA; and
   a second switch coupled to the means for providing the feedback signal to the second VE linearizer.

8. A signal distortion compensation system comprising:
   a first Volterra Engine (VE) linearizer;
   a second VE linearizer coupled to the first VE linearizer; and
   a feedback circuitry coupled to the second VE linearizer, wherein the first VE linearizer is configured to linearize and reduce distortion in an output signal, and the second VE linearizer is optimized to de-embed feedback distortion in a feedback signal.

9. The signal distortion compensation system of claim 8 further comprising:
- a power amplifier (PA) coupled to the first VE linearizer;
- a nonlinear (NL) bypass circuit configured to receive a non-amplified output of the first VE linearizer, and
- a switch coupled to the feedback circuitry,
- wherein the feedback signal comprises feedback distortion without substantial amplification distortion when the switch connects the feedback circuitry to the NL bypass circuit, and the feedback signal comprises feedback distortion and amplification distortion when the switch connects the feedback circuitry to the PA.

10. The signal distortion compensation system of claim 8 further comprising:
- a DAC and ADC circuits block that converts the non-amplified output of the first VE linearizer from a digital waveform to an analog waveform and converts the feedback signal from an analog waveform into a digital waveform.

11. The signal distortion compensation system of claim 8, wherein amplification distortion is isolated from the feedback signal based upon digital signal processing.

12. The signal distortion compensation system of claim 8 further comprising:
- a feedback inverse response isolation and de-embedding block coupled to the first VE linearizer, the second VE linearizer, and the feedback circuitry,
- wherein the feedback inverse response isolation and de-embedding block is configured to send an alternative feedback signal comprising substantially no feedback distortion to the first VE linearizer, wherein the alternative feedback signal is obtained based upon model parameters from the second FE linearizer.

13. The signal distortion compensation system of claim 8 further comprising:
- a feedback forward response isolation and embedding block coupled to the first VE linearizer and the second VE linearizer,
- wherein the feedback forward response isolation and embedding block is configured to send an alternative reference signal to the first VE linearizer to counter distortion feedback in the feedback signal, wherein the alternative reference signal is obtained based upon model parameters from the second VE linearizer and the feedback signal.

14. The signal distortion compensation system of claim 8 further comprising:
- a power amplifier (PA) coupled to the first VE linearizer;
- a nonlinear (NL) bypass circuit configured to receive a non-amplified output of the first VE linearizer;
- a first switch coupled to the PA; and
- a second switch coupled to the feedback circuitry.

15. A signal distortion compensation method comprising:
- using a first Volterra Engine (VE) linearizer to linearize an output signal by compensating for amplification distortion; and
- using a second VE linearizer coupled to the first VE linearizer to de-embed signal distortion introduced by feedback circuitry coupled to the second VE linearizer to improve distortion compensation and linearization efficiency of a VE based system.

16. The signal distortion compensation method of claim 15, the method further comprising bypassing an amplified output signal by sending a pre-distorted output signal to the feedback circuitry.

17. The signal distortion compensation method of claim 15, the method further comprising modeling feedback distortion parameters at the second VE linearizer based upon the output signal and a feedback signal received from the feedback circuitry.

18. The signal distortion compensation method of claim 17, the method further comprising forwarding the model feedback distortion parameters generated by the second VE linearizer to a feedback inverse response isolation and de-embedding block.

19. The signal distortion compensation method of claim 18, the method further comprising using the model feedback distortion parameters to de-embed the feedback distortion from the feedback signal and obtain an alternative feedback signal substantially free of feedback distortion at the feedback inverse response isolation and de-embedding block.

20. The signal distortion compensation method of claim 19, the method further comprising feeding the alternative feedback signal to the first VE linearizer.

\* \* \* \* \*